(12) United States Patent
Shimazaki et al.

(10) Patent No.: US 8,300,843 B2
(45) Date of Patent: Oct. 30, 2012

(54) SOUND EFFECT CIRCUIT AND PROCESSING METHOD

(75) Inventors: Kouya Shimazaki, Tokyo (JP); Naotaka Saito, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 899 days.

(21) Appl. No.: 12/339,127

(22) Filed: Dec. 19, 2008

(65) Prior Publication Data

US 2009/0169026 A1 Jul. 2, 2009

(30) Foreign Application Priority Data

Dec. 27, 2007 (JP) .................................. 2007-335992

(51) Int. Cl.
 *H03G 3/00* (2006.01)
(52) U.S. Cl. .................. 381/81; 381/61; 381/56
(58) Field of Classification Search .............. 381/81, 381/61, 56
 See application file for complete search history.

(56) References Cited

U.S. PATENT DOCUMENTS

| | | | | | |
|---|---|---|---|---|---|
| 4,586,905 | A | * | 5/1986 | Groff | 434/307 R |
| 5,572,591 | A | * | 11/1996 | Numazu et al. | 381/1 |
| 5,617,478 | A | * | 4/1997 | Tagami et al. | 381/56 |
| 5,742,688 | A | * | 4/1998 | Ogawa et al. | 381/17 |
| 5,930,752 | A | * | 7/1999 | Kawaguchi et al. | 704/270.1 |
| 6,718,296 | B1 | * | 4/2004 | Reynolds et al. | 704/200.1 |
| 7,555,766 | B2 | * | 6/2009 | Kondo et al. | 725/12 |
| 2002/0073417 | A1 | * | 6/2002 | Kondo et al. | 725/10 |
| 2008/0273710 | A1 | * | 11/2008 | Nakabayashi | 381/81 |
| 2009/0169026 | A1 | * | 7/2009 | Shimazaki et al. | 381/61 |
| 2010/0189270 | A1 | * | 7/2010 | Noguchi | 381/56 |
| 2010/0208918 | A1 | * | 8/2010 | Noguchi | 381/107 |
| 2011/0075851 | A1 | * | 3/2011 | LeBoeuf et al. | 381/56 |

FOREIGN PATENT DOCUMENTS

| | | |
|---|---|---|
| JP | 63-221708 | 9/1988 |
| JP | 63-246908 | 10/1988 |
| JP | 05-276593 | 10/1993 |
| JP | 05-292592 | 11/1993 |
| JP | 2000-092587 | 3/2000 |
| JP | 2002-057554 | 2/2002 |
| JP | 2005079877 | 3/2005 |
| JP | 2006279194 | 10/2006 |
| JP | 2009159375 A | * 7/2009 |

OTHER PUBLICATIONS

Office Action From Japanese Patent Office Dated Oct. 20, 2009 With English Translation.
Japanese Patent Office Action Dated Feb. 4, 2010 With English Translation.

* cited by examiner

*Primary Examiner* — Laura Menz
(74) *Attorney, Agent, or Firm* — Volentine & Whitt, PLLC

(57) ABSTRACT

A sound effect circuit and processing method are disclosed. An input audio signal is input to a digital sound effect unit, an output signal is generated and output with a sound effect in accordance with an effect amount of a certain value from the input audio signal using the digital sound effect unit, the input audio signal is also input to a silence state detection unit, a silence detect signal is generated and output when detecting that the current state of the input audio signal is a silence state using the silence state detection unit, the output signal is input to a sound effect amount control unit, and an output audio signal is output using the sound effect amount control unit, wherein the sound effect amount control unit changes the effect amount to be smaller than the certain value when the silence detect signal is generated.

6 Claims, 6 Drawing Sheets

SOUND EFFECT CIRCUIT AND PROCESSING METHOD

BACKGROUND OF THE INVENTION

1. Field of the Invention

The present invention relates to a sound effect circuit and processing method for providing sound effects to a digital audio signal using a pulse code modulation (PCM) scheme or the like

2. Description of the Related Art

A sound effect circuit that provides various sound effects to a digital audio signal is well known to those skilled in the art. In this sound effect circuit, for example, a feedback circuit such as an infinite impulse response (IIR) filter may be used as a band pass filter which divides an input sound into a high-pitched tone, middle-pitched tone and low-pitched tone. However, in this feedback circuit, there is a problem that some limit cycle oscillation noise significantly occur when the level of an input audio signal is close to a silence state. As a means for settling this problem may be considered a method that internally converts the number of quantized bits of an input audio signal, for example, 16 bits into 24 bits and performs a 24-bit operation to realize a sound effect function. However, this method has a disadvantage of increasing a circuit scale.

On the other hand, as a method or apparatus for reducing unpleasantness given to a viewer due to noise in the silence state, Japanese Patent Laid-open Publication No. 2005-079877 discloses a configuration that mutes the output of audio data when the level of a clock supplied together with the audio data is lower than a threshold value. Also, Japanese Patent Laid-open Publication No. 2006-279194 discloses a configuration that commences fade-out when the output level of an audio signal is lower than a threshold value for a certain period and subsequently performs muting when the output level of the audio signal is lower than a threshold value for a certain period.

SUMMARY OF THE INVENTION

However, the configurations disclosed in the above documents are basically techniques relating to a volume control circuit such as an amplifier or the like, which premise that noise such as external noise or thermal noise is steadily present and this noise also gives unpleasantness to a person in the silence state. That is, these techniques have been proposed to suppress a volume gain in the silence state, rather than noise generation itself.

An object of the present invention is to provide a sound effect circuit and processing method which can suppress generation of noise from the sound effect circuit in a silence state without increasing a circuit scale.

In accordance with an aspect of the present invention, the above and other objects can be accomplished by the provision of a sound effect circuit comprising: a digital sound effect unit configured to be supplied with an input audio signal and output an output signal which is generated with a sound effect in accordance with an effect amount of a certain value from the input audio signal; a silence state detection unit configured to be supplied with the input audio signal and output a silence detect signal which is generated when detecting that the current state of the input audio signal is a silence state; and a sound effect amount control unit configured to be supplied with the output signal and output an output audio signal, wherein the sound effect amount control unit changes the effect amount to be smaller than the certain value when the silence detect signal is generated. In accordance with another aspect of the present invention, there is provided a sound effect processing method of a sound effect circuit, comprising: inputting an input audio signal to a digital sound effect unit and outputting from it an output signal which is generated with a sound effect in accordance with an effect amount of a certain value from the input audio signal; inputting the input audio signal to a silence state detection unit and outputting from it a silence detect signal which is generated when detecting that the current state of the input audio signal is a silence state; and inputting the output signal to a sound effect amount control unit and outputting from it an output audio signal, wherein the sound effect amount control unit changes the effect amount to be smaller than the certain value when the silence detect signal is generated.

According to a sound effect circuit and processing method of the present invention, an arithmetic circuit of the same bit number as that of quantized bits of an input audio signal is used. Therefore, it is possible to suppress generation of noise from the sound effect circuit in a silence state without increasing a circuit scale.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, preferred embodiments of the invention will be described in conjunction with the annexed drawings.

<First Embodiment>

Figure 1:
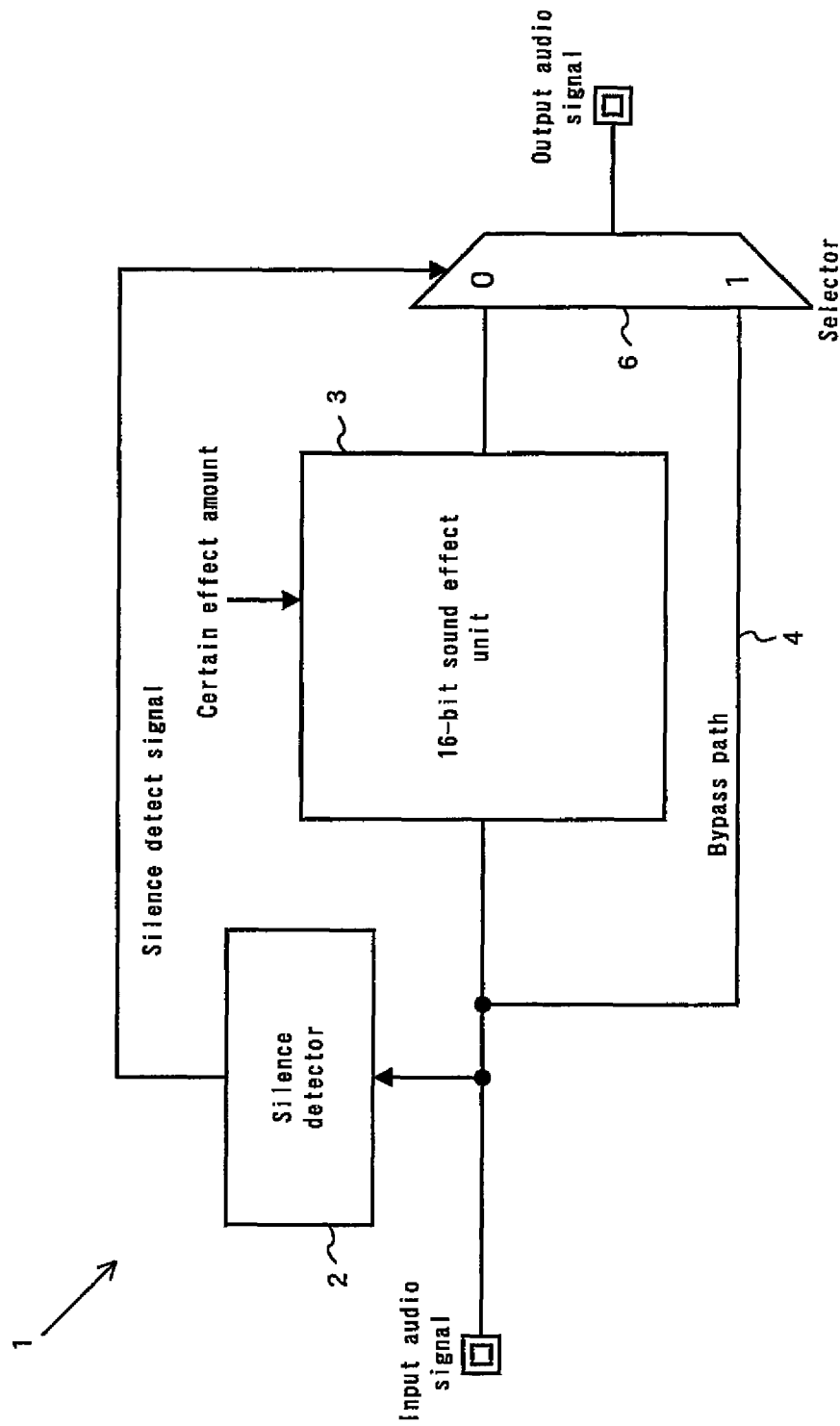
FIG. 1 is a block diagram showing the configuration of a sound effect circuit according to a first embodiment of the present invention.

FIG. 1 shows the configuration of a sound effect circuit according to a first embodiment of the present invention. The sound effect circuit, denoted by reference numeral 1, includes a silence detector 2, a 16-bit sound effect unit 3, and a bypass path 4. The sound effect circuit 1 may be implemented as a single circuit device or a part of a semiconductor integrated circuit in which it is integrated with a digital signal processor (DSP) for performing an audio codec process and other devices.

The 16-bit sound effect unit 3 is a digital sound effect unit which is a constituent element of the present invention, and functions to provide a specific sound effect to a 16-bit quantized PCM-format input audio signal through a digital operation and output the resulting signal as a 16-bit quantized PCM-format output audio signal. The specific sound effect of the 16-bit sound effect unit 3 may be considered as, for example, enhancing or attenuating a specific low-frequency band, mid-frequency band or high-frequency band in an audio frequency band. Of course, the present invention is not limited thereto, and the 16-bit sound effect unit 3 may provide various sound effects including a conversation voice enhancement effect, echo suppression effect, etc. The level of an effect amount of the sound effect provided by the 16-bit sound effect unit 3 can be arbitrarily preset to a certain effect amount within the range from a minimum level to a maximum level. The minimum level is a zero level at which the input audio signal is just the output audio signal. Of course, the level of the effect amount can be freely set even during the operation of the sound effect circuit 1. The 16-bit sound effect unit 3 is typically composed of a feedback circuit such as an IIR filter, as stated previously. However, in the present embodiment, the 16-bit sound effect unit 3 always processes the 16-bit input audio signal on a 16-bit basis without performing a 24-bit operation with respect to the 16-bit input audio signal. This may result in a concern that some limit cycle oscillation noise will occur.

A selector 6 selects any one of the input audio signal supplied through the bypass path 4 and the output audio signal from the 16-bit sound effect unit 3 in response to a silence detect signal from the silence detector 2, and outputs the selected audio signal as an output audio signal of the sound effect circuit 1. That is, in the case where the silence detect signal is "0", the selector 6 selects and outputs the output audio signal from the 16-bit sound effect unit 3. In the case where the silence detect signal is "1", the selector 6 directly outputs the input audio signal supplied through the bypass path 4.

The silence detector 2 functions to monitor the current state of the input audio signal and to, when the monitored state is a silence state, generate the silence detect signal and supply it to the selector 6. When the volume level of the input audio signal is within a predetermined threshold value range for a predetermined time or more, the silence detector 2 detects "that the current state of the input audio signal is the silence state" and thus outputs the silence detect signal "1". Otherwise, the silence detector 2 outputs the silence detect signal "0".

Figure 2:
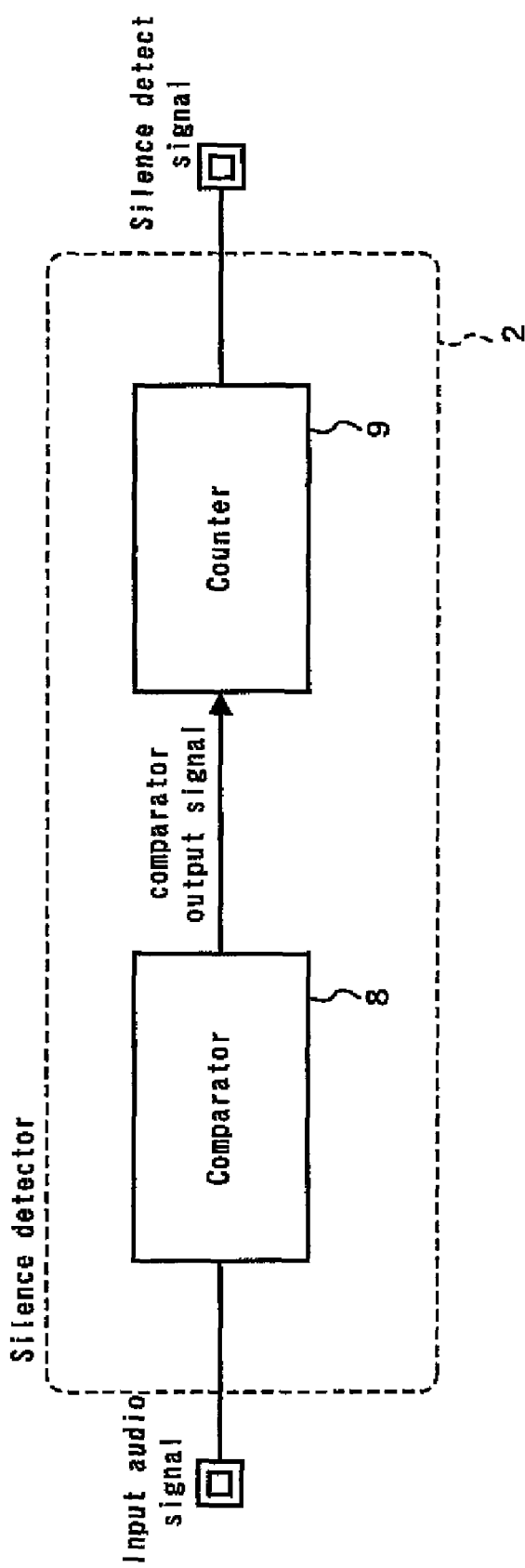
FIG. 2 is a block diagram showing the internal configuration of a silence detector shown in FIG. 1.

FIG. 2 shows the internal configuration of the silence detector 2 shown in FIG. 1. The silence detector 2 includes a comparator 8 and a counter 9. Here, the Input audio signal is supplied to the comparator 8, which performs a level comparison/determination with respect to the input audio signal, generates a comparator output signal according to an operation procedure to be described below and supplies it to the counter 9. The counter 9 performs time counting in response to the comparator output signal and, when a result of the time counting reaches a predetermined time count, generates the silence detect signal and supplies it to the selector 6.

Figure 3:
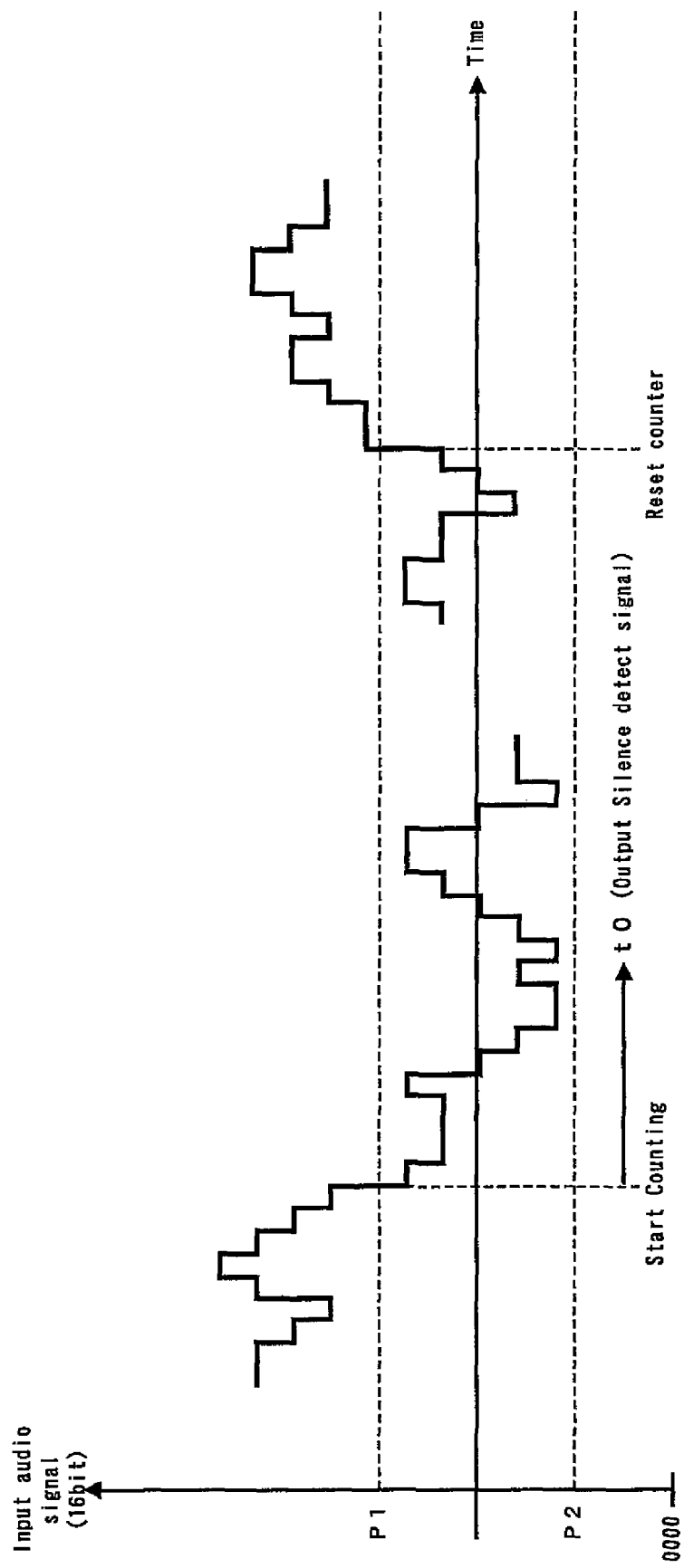
FIG. 3 is a chart of an input audio signal illustrating the operation of the silence detector.

FIG. 3 illustrates the operation procedure of the silence detector 2. This drawing is a chart in which a Y axis represents the volume level of the input audio signal and an axis of abscissa represents time. The initial output value of each of the comparator 8 and counter 9 in the silence detector 2 shown in FIG. 2 is set to "0". When the level of the input audio signal is between threshold values P1 and P2 as shown, the comparator 8 outputs "1" as the comparator output signal. Otherwise, the comparator 8 outputs "0" as the comparator output signal. The threshold values P1 and P2 are set as the boundaries of a level range of the input audio signal in which the current state of the input audio signal is determined to be the silence state.

The counter 9 starts time counting at a rising edge of the comparator output signal. Then, when the time count reaches to, the counter 9 stops the time counting and outputs the silence detect signal "1" while holding the time count. On the other hand, when the comparator output signal is "0", the counter 9 resets the time count and outputs "0" as the silence detect signal.

The selector 6 shown in FIG. 1 outputs the input audio signal passed through the bypass path 4 directly as the output audio signal based on the above operation of the silence detector 2, so that the effect amount substantially becomes "0". When the current state of the input audio signal is changed from the silence state to a sound state, the silence detector 2 outputs the silence detect signal "0". As a result, the output audio signal processed by the 16-bit sound effect unit 3 is outputted by the selection operation of the selector 6, so that the effect amount is restored to its original value.

In the above-described first embodiment of the present invention, in the silence state, the output of the sound effect circuit, which is a noise generation source, is not muted, but bypasses the sound effect circuit. Therefore, it is possible to avoid generation of noise from the sound effect circuit in the silence state. Also, because a low bit operation is sufficient for the sound effect circuit, a bus line area or various arithmetic circuits can be compacted, thereby making it possible to reduce a chip size.

<Second Embodiment>

Figure 4:
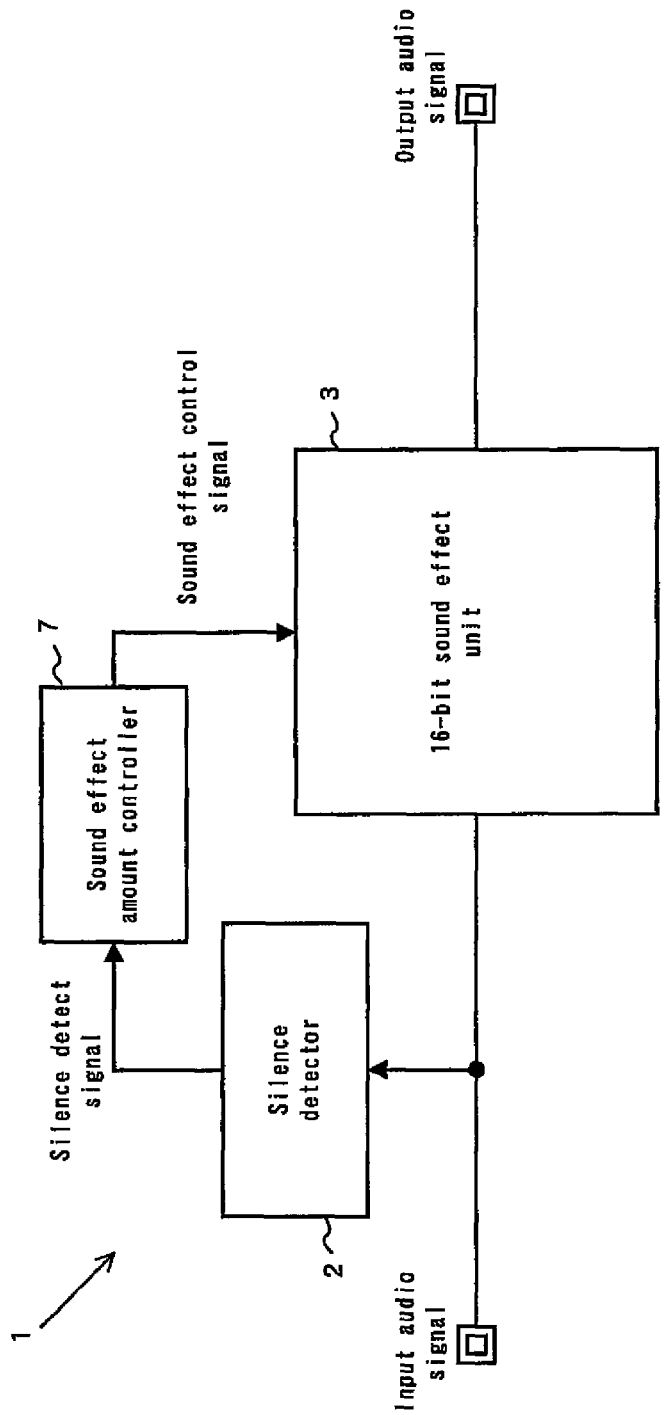
FIG. 4 is a block diagram showing the configuration of a sound effect circuit according to a second embodiment of the present invention.

FIG. 4 shows the configuration of a sound effect circuit according to a second embodiment of the present invention. The sound effect circuit, denoted by reference numeral 1, includes a silence detector 2, a 16-bit sound effect unit 3, and a sound effect amount controller 7. The silence detector 2 and 16-bit sound effect unit 3 have the same functions as those in the first embodiment. However, the silence detector 2 supplies a silence detect signal to the sound effect amount controller 7. Also, the 16-bit sound effect unit 3 increases or reduces its effect amount in response to a sound effect control signal supplied from the sound effect amount controller 7.

The sound effect amount controller 7 varies the level of the sound effect control signal in response to the silence detect signal to control an effect amount of a sound effect that the 16-bit sound effect unit 3 provides to an input audio signal. In detail, when the current state of the input audio signal is changed from a sound state to a silence state, the sound effect amount controller 7 reduces the effect amount gradually. On the other hand, when the current state of the input audio signal is changed from the silence state to the sound state, the sound effect amount controller 7 increases the effect amount gradually to restore the effect amount to its original value.

A time for which the effect amount varies gradually, namely, a fade time can be set to an arbitrary time, for example, several times a sampling period. For example, the fade time may be set from several 100? to several ?.

Figure 5:
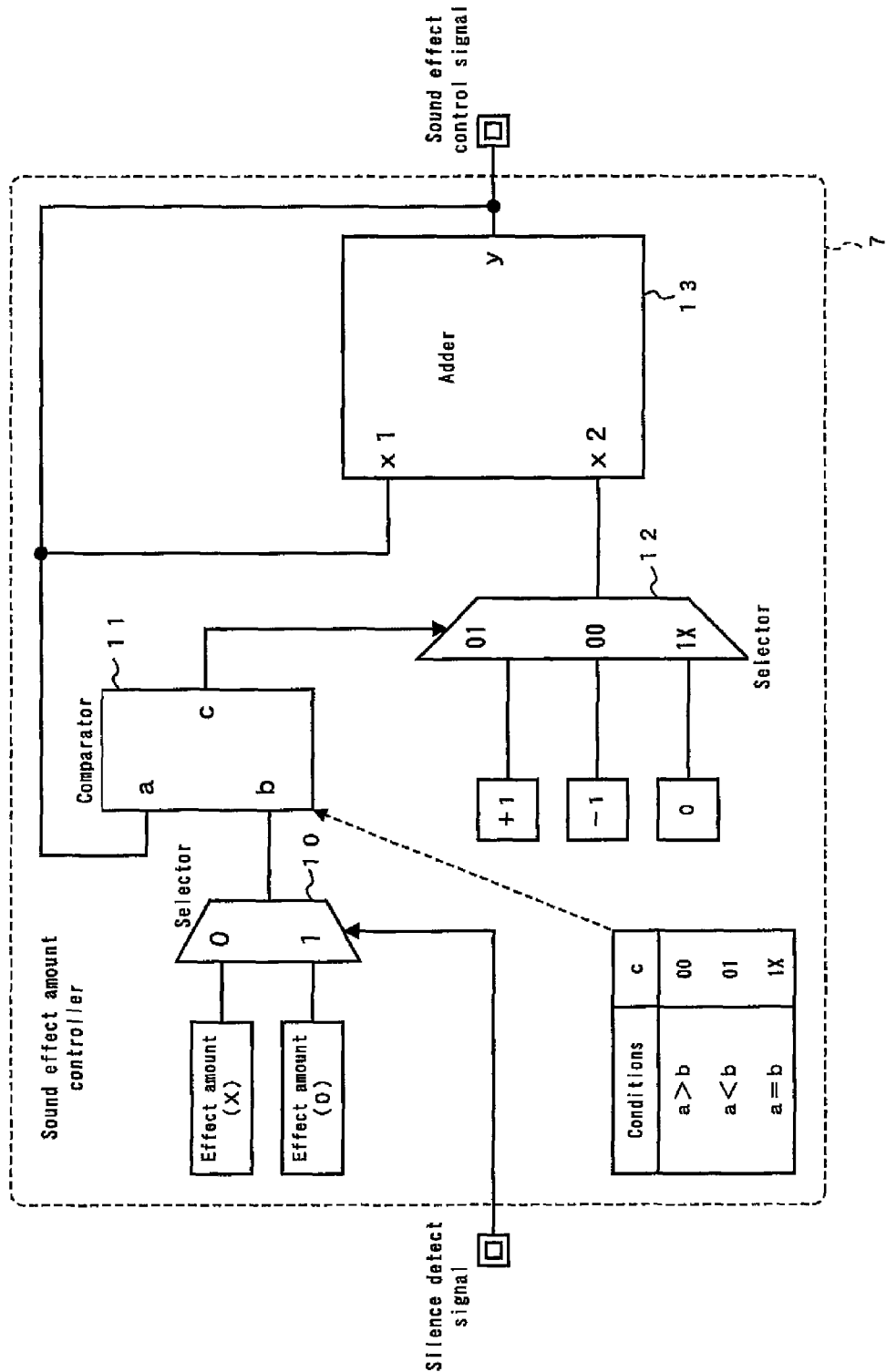
FIG. 5 is a block diagram showing the internal configuration of a sound effect amount controller shown in FIG. 4.

FIG. 5 shows the internal configuration of the sound effect amount controller shown in FIG. 4. The sound effect amount controller 7 includes a comparator 11, a selector 10, a selector 12, and an adder 13. As shown, the silence detect signal supplied to the sound effect amount controller 7 is supplied to the selector 10. The selector 10 selects and outputs any one of a predetermined effect amount (X) and an effect amount (0) corresponding to sound effect unavailability in response to the silence detect signal.

The output of the selector 10 is supplied to an input terminal b of the comparator 11. An output terminal y of the adder 13 is connected to another input terminal a of the comparator 11, an output terminal c of which is connected to the selector 12. As shown, the comparator 11 operates to output a signal level "00" at the output terminal c when signal levels at the input terminals are a>b, a signal level "01" when a<b, and a signal level "1X" (X is arbitrary) when a=b.

The selector 12 selects and outputs any one of integers −1, 0 and +1 separately supplied thereto based on the signal level at the output terminal c of the comparator 11. As shown, the selector 12 outputs "−1" when the signal level at the output terminal c is "00", "0" when the signal level at the output terminal c is "1X", and "+1" when the signal level at the output terminal C is "01".

The adder 13 adds input signals at two input terminals x1 and x2 thereof and outputs a result of the addition at the output terminal y. The output of the output terminal y is outputted directly as the sound effect control signal of the sound effect amount controller 7 and is also fed back to the input terminal x1. Also, the output of the selector 12 is supplied to the input terminal x2.

The operation of the sound effect amount controller 7 shown in FIG. 5 will hereinafter be described. It is assumed that the silence detector 2 detects the silence state, and outputs the silence detect signal "1", and supplies it to the sound effect amount controller 7. As a result, the selector 10 of the sound effect amount controller 7 selects and outputs the effect amount (0). The effect amount (0) is compared with the signal level of the output terminal y of the adder 13 by the comparator 11. When the signal level of the output terminal y of the adder 13 is larger than the effect amount (0), the output of the selector 12 becomes "−1". Subsequently, "−1" is sequentially added to the signal level of the output terminal y of the adder 13 synchronously with a circuit clock, so that the signal level of the output terminal y is gradually reduced. In the end, at the time that the effect amount (0) and the signal level of the output terminal y become equal, the output of the selector 12 becomes "0" and the signal level of the output terminal y is thus maintained at the effect amount (0).

Next, it is assumed that the silence detector 2 detects the sound state and outputs the silence detect signal "0". In this case, in the sound effect amount controller 7, the effect amount (X) is outputted from the selector 10 and then compared with the signal level of the output terminal y of the adder 13 by the comparator 11. Then, "−1" or "1" is sequentially added to the signal level of the output terminal y of the adder 13 synchronously with the clock according to whether or not the signal level of the output terminal y is larger than the effect amount (X). In the end, at the time that the effect amount (X) and the signal level of the output terminal y become equal, the output of the selector 12 becomes "0" and the signal level of the output terminal y is thus maintained at the effect amount (X).

In the above-described second embodiment of the present invention, the effect amount of the 16-bit sound effect unit 3 becomes gradually unable toward the effect amount (0) in the silence state and is gradually restored to its original effect amount (X) in the sound state. In the first embodiment, the effect amount is abruptly changed to "0" in the silence state and, subsequently, abruptly restored to its original value in the sound state. For this reason, there is a concern that sound quality will unnaturally vary before and after the silence detection. In contrast, in the present second embodiment, the sound effect amount controller performs the control operation to gradually vary the effect amount of the sound effect, so as to reduce unnaturalness of the sound quality variation before and after the silence detection. That is, the second embodiment realizes the effect of removing unnaturalness of a sound quality variation before and after the silence state, as well as the effect of reducing noise in the silence state. This second embodiment fades in or fades out, namely, gradually varies the effect amount of the sound effect, not the volume level as in the conventional circuit.

<Third Embodiment>

Figure 6:
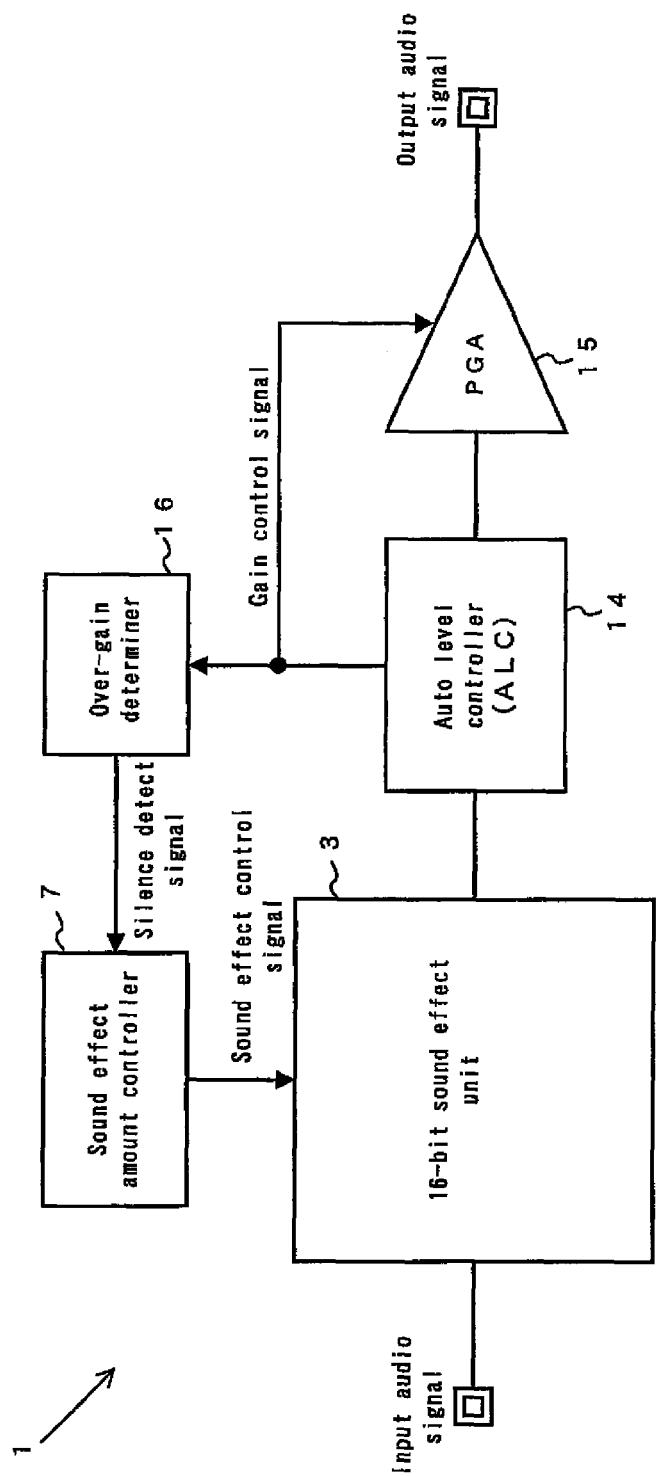
FIG. 6 is a block diagram showing the configuration of a sound effect circuit according to a third embodiment of the present invention.

FIG. 6 shows the configuration of a sound effect circuit according to a third embodiment of the present invention. The sound effect circuit, denoted by reference numeral 1, includes a sound effect amount controller 7, a 16-bit sound effect unit 3, an auto level controller (ALC) 14, a programmable gain amplifier (PGA) 15, and an over-gain determiner 16. The 16-bit sound effect unit 3 and sound effect amount controller 7 have the same functions as those in the second embodiment.

The auto level controller 14 functions to output an input audio signal directly as an output audio signal. The auto level controller 14 also functions to generate a gain control signal based on the signal level of the input audio signal and supply it to the programmable gain amplifier 15, so as to maintain the volume level range of the audio signal to be constant. The programmable gain amplifier 15 varies an amplification factor thereof in response to the gain control signal supplied from the auto level controller 14, amplifies the input audio signal by the varied amplification factor and outputs the amplified audio signal as the output audio signal. That is, when the volume level of the audio signal becomes so low that the audio signal enters the silence state, the auto level controller 14 varies the gain control signal to raise the amplification factor of the programmable gain amplifier 15, so as to maintain the volume level of the audio signal to be constant.

The over-gain determiner 16 functions to receive the gain control signal outputted from the auto level controller 14 and to, when the level of the gain control signal becomes higher than or equal to a predetermined threshold value, generate a silence detect signal and supply it to the sound effect amount controller 7. This predetermined threshold value is set to a level of the gain control signal which is determined to be abnormally high.

The sound effect amount controller 7 suppresses the residual noise by attenuating the effect amount of the 16-bit sound effect unit 3 in the same manner as in the second embodiment in response to the silence detect signal supplied from the over-gain determiner 16.

In the above-described third embodiment of the present invention, in the sound effect circuit 1 having the auto level controller 14, the same effects as in the second embodiment are also obtained by detecting the silence state based on the fact that the level of the gain control signal generated by the auto level controller 14 is abnormally high. As another alternative, the second embodiment and the third embodiment may be combined. In this case, the sound effect amount controller 7 may control the effect amount of the 16-bit sound effect unit 3 based on the silence detect signal "1" outputted from any one or both of the silence detector 2 and over-gain determiner 16. Therefore, it is possible to appropriately select any one silence detect signal and remove noise based on the selected silence detect signal, thereby coordinating the noise removal more flexibly. Further, in the case where a plurality of 16-bit sound effect units 3 are provided, a specific one of the 16-bit sound effect units may control the effect amount based on the silence detect signal from the silence detector 2 and the other 16-bit sound effect units may control the effect amount based on the silence detect signal from the over-gain determiner 16. In this case, a circuit design can be made for every sound effect unit, thereby facilitating the entire circuit design.

Also, although the auto level controller 14 and programmable gain amplifier 15 have been described in the third embodiment to be provided downstream of the 16-bit sound effect unit 3, the present invention is not limited thereto. For example, any one or both of the auto level controller 14 and programmable gain amplifier 15 may be provided upstream of the 16-bit sound effect unit 3.

In the plurality of embodiments stated above, although the digital sound effect unit performing the 16-bit operation has been depicted as an example of the sound effect unit, the present invention is not limited thereto. For example, the present invention is also applicable to a sound effect circuit performing a low bit operation in which there is a concern that noise will occur in the silence state. Further, the digital sound effect unit is adequate as long as it can control the effect amount based on the sound effect control signal. In addition, the present invention is applicable to various sound effect circuits, as well as a circuit that increases or reduces a specific frequency band in an audio frequency band.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

This application is based on a Japanese Patent Application No. 2007-335992 which is hereby incorporated by reference.

What is claimed is:

1. A sound effect circuit, comprising:
   a digital sound effect unit configured to be supplied with an input audio signal and output an output signal which is generated with a sound effect in accordance with an effect amount of a certain value from the input audio signal;
   a silence state detection unit configured to be supplied with the input audio signal and output a silence detect signal which is generated when detecting that a current state of the input audio signal is a silence state; and
   a sound effect amount control unit configured to be supplied with the output signal and output an output audio signal,
   wherein the sound effect amount control unit changes the effect amount to be smaller than the certain value when the silence detect signal is generated.

2. The sound effect circuit according to claim 1, wherein the sound effect amount control unit changes the effect amount to zero when the silence detect signal is generated.

3. The sound effect circuit according to claim 2, wherein the sound effect amount control unit outputs the input audio signal directly as the output audio signal instead of the output signal obtained from the digital sound effect unit when the silence detect signal is generated.

4. The sound effect circuit according to claim 1, wherein the sound effect amount control unit gradually reduces the effect amount or gradually changes the effect amount to zero when the silence detect signal is generated.

5. The sound effect circuit according to claim 1, further comprising an auto level control circuit configured to change an amplification gain based on a volume level of the input audio signal or the output audio signal to control a range of the volume level of the output audio signal,
   wherein the silence state detection unit detects that the current state is the silence state when the amplification gain exceeds a predetermined threshold value.

6. A sound effect processing method of a sound effect circuit, comprising:
   inputting an input audio signal to a digital sound effect unit to provide an output signal which is generated with a sound effect in accordance with an effect amount of a certain value from the input audio signal;
   inputting the input audio signal to a silence state detection unit to provide a silence detect signal which is generated when detecting that a current state of the input audio signal is a silence state; and
   inputting the output signal to a sound effect amount control unit to provide an output audio signal,
   wherein the sound effect amount control unit changes the effect amount to be smaller than the certain value when the silence detect signal is generated.

* * * * *